(12) United States Patent
Kang

(10) Patent No.: US 11,735,542 B2
(45) Date of Patent: Aug. 22, 2023

(54) SEMICONDUCTOR PACKAGE

(71) Applicant: SAMSUNG ELECTRONICS CO., LTD., Suwon-si (KR)

(72) Inventor: Taeho Kang, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/946,326

(22) Filed: Sep. 16, 2022

(65) Prior Publication Data

US 2023/0014987 A1    Jan. 19, 2023

Related U.S. Application Data

(63) Continuation of application No. 17/101,443, filed on Nov. 23, 2020, now Pat. No. 11,450,632.

(30) Foreign Application Priority Data

Apr. 24, 2020   (KR) .................. 10-2020-0049741

(51) Int. Cl.
*H01L 23/00*     (2006.01)
(52) U.S. Cl.
CPC .............. *H01L 24/05* (2013.01); *H01L 24/13* (2013.01); *H01L 24/20* (2013.01); *H01L 2224/05025* (2013.01); *H01L 2224/13021* (2013.01)
(58) Field of Classification Search
CPC ..................... H01L 24/05; H01L 24/13; H01L 2224/13021; H01L 2224/05025; H01L 23/49827
See application file for complete search history.

(56) References Cited

U.S. PATENT DOCUMENTS

| | | | |
|---|---|---|---|
| 5,909,058 A | 6/1999 | Yano et al. | |
| 6,046,499 A | 4/2000 | Yano et al. | |
| 7,030,487 B1* | 4/2006 | Keng | H01L 23/36 |
| | | | 257/E23.101 |
| 7,368,821 B2 | 5/2008 | Kim et al. | |
| 7,514,768 B2 | 4/2009 | Andoh | |
| 7,855,443 B2 | 12/2010 | Tsai et al. | |

(Continued)

FOREIGN PATENT DOCUMENTS

| | | | | |
|---|---|---|---|---|
| EP | 3 667 719 A1 | 6/2020 | | |
| EP | 3667719 A1 * | 6/2020 | ............. | H01L 23/31 |

*Primary Examiner* — Mamadou L Diallo
(74) *Attorney, Agent, or Firm* — Lee IP Law, P.C.

(57) ABSTRACT

A semiconductor package includes a redistribution structure including an insulating layer having an upper surface and a lower surface, a redistribution pad and a redistribution pattern on the lower surface of the insulating layer and electrically connected to each other, and a passivation layer on the lower surface of the insulating layer and having an opening exposing at least a portion of the redistribution pad; a semiconductor chip on the redistribution structure and including a connection pad electrically connected to the redistribution pad; an encapsulant on the redistribution structure and encapsulating the semiconductor chip; and a connection bump and a dummy bump on the passivation layer, wherein the redistribution pattern has a width narrower than a width of the redistribution pad, the connection bump vertically overlaps the redistribution pad, and the dummy bump vertically overlaps the redistribution pattern.

20 Claims, 11 Drawing Sheets

(56) References Cited

U.S. PATENT DOCUMENTS

| | | | |
|---|---|---|---|
| 8,525,333 B2* | 9/2013 | Kanetaka | H01L 23/49838 |
| | | | 257/737 |
| 9,257,411 B2 | 2/2016 | Pagaila et al. | |
| 9,607,967 B1* | 3/2017 | Shih | H01L 21/6835 |
| 9,985,008 B2 | 5/2018 | Shi et al. | |
| 11,182,532 B2* | 11/2021 | Pratapa | G06F 30/392 |
| 2009/0001542 A1 | 1/2009 | Kim | |
| 2011/0095418 A1* | 4/2011 | Lim | H01L 24/14 |
| | | | 257/737 |
| 2012/0126388 A1 | 5/2012 | Lin et al. | |
| 2014/0124949 A1* | 5/2014 | Paek | H01L 21/6835 |
| | | | 438/126 |
| 2014/0131856 A1* | 5/2014 | Do | H01L 23/5384 |
| | | | 257/737 |
| 2016/0276307 A1* | 9/2016 | Lin | H01L 23/562 |
| 2018/0053732 A1* | 2/2018 | Baek | H01L 23/5389 |
| 2018/0358951 A1* | 12/2018 | Ohkubo | H03H 9/02244 |
| 2019/0214359 A1* | 7/2019 | Yeon | H01L 21/565 |
| 2020/0083201 A1* | 3/2020 | Suk | H01L 24/09 |
| 2020/0091215 A1* | 3/2020 | Jang | H01L 27/14634 |
| 2020/0203300 A1* | 6/2020 | Huang | H01L 24/14 |
| 2021/0082872 A1* | 3/2021 | Yu | H01L 25/18 |
| 2021/0183756 A1* | 6/2021 | Chae | H01L 23/49822 |
| 2021/0183781 A1* | 6/2021 | Liao | H01L 23/3672 |

* cited by examiner

SEMICONDUCTOR PACKAGE

CROSS-REFERENCE TO RELATED APPLICATIONS

This is a continuation application based on pending application Ser. No. 17/101,443, filed Nov. 23, 2020, the entire contents of which is hereby incorporated by reference.

Korean Patent Application No. 10-2020-0049741, filed on Apr. 24, 2020, in the Korean Intellectual Property Office, and entitled: "Semiconductor Package," is incorporated by reference herein in its entirety.

BACKGROUND

1. Field

Embodiments relate to a semiconductor package.

2. Description of the Related Art

In a semiconductor package, a conductive bump below a redistribution structure may be used to provide an electrical path for electrically connecting the package and a mounting substrate and a thermal path for transferring heat generated from a semiconductor chip externally. Due to this characteristic of such a conductive bump, the conductive bump may be formed on a pad exposed through an opening of a solder resist, and may not be formed on a circuit pattern redistributing the pad.

SUMMARY

Embodiments are directed to a semiconductor package, including a redistribution structure including an insulating layer having an upper surface and a lower surface, a redistribution pad and a redistribution pattern on the lower surface of the insulating layer and electrically connected to each other, and a passivation layer on the lower surface of the insulating layer and having an opening exposing at least a portion of the redistribution pad; a semiconductor chip on the redistribution structure and including a connection pad electrically connected to the redistribution pad; an encapsulant on the redistribution structure and encapsulating the semiconductor chip; and a connection bump and a dummy bump on the passivation layer, wherein the redistribution pattern has a width narrower than a width of the redistribution pad, the connection bump vertically overlaps the redistribution pad, and the dummy bump vertically overlaps the redistribution pattern.

Embodiments are also directed to a semiconductor package, including a redistribution structure including a plurality of redistribution pads, a plurality of redistribution patterns and a plurality of redistribution vias electrically connecting the plurality of redistribution pads to each other, and a passivation layer covering a lowermost redistribution pad among the plurality of redistribution pads and a lowermost redistribution pattern among the plurality of redistribution patterns and having a first opening exposing at least a portion of the lowermost redistribution pad; a semiconductor chip on the redistribution structure and including a connection pad electrically connected to an uppermost redistribution pad, among the plurality of redistribution pads; an encapsulant on the redistribution structure and encapsulating the semiconductor chip; a connection bump filling the first opening of the passivation layer and electrically connected to the lowermost redistribution pad; and a dummy structure including a dummy pad on a lower surface of the passivation layer covering the lowermost redistribution pattern, and a dummy bump on the dummy pad.

Embodiments are also directed to a semiconductor package, including a redistribution structure including one or more insulating layers, and a redistribution pad and a redistribution pattern on a lower surface of a lowermost insulating layer among the one or more insulating layers and electrically connected to each other; a semiconductor chip on the redistribution structure and electrically connected to the redistribution pad and the redistribution pattern; a passivation layer covering the redistribution pad and the redistribution pattern and having an opening exposing the redistribution pad; a connection bump disposed in the opening of the passivation layer; and a dummy bump on a lower surface of the passivation layer. A distance between the lower surface of the lowermost insulating layer and an upper end of the connection bump may be less than a distance between the lower surface of the lowermost insulating layer and an upper end of the dummy bump.

BRIEF DESCRIPTION OF DRAWINGS

Features will become apparent to those of skill in the art by describing in detail example embodiments with reference to the attached drawings in which.

DETAILED DESCRIPTION

Figure 1A:
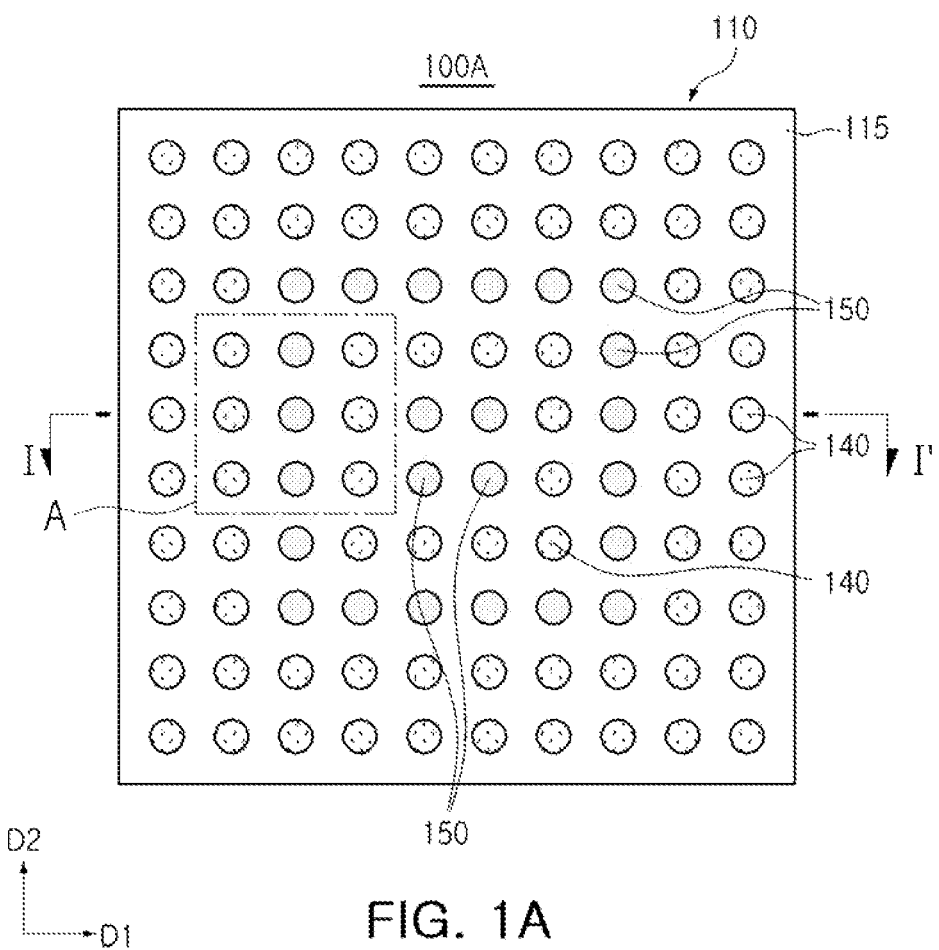
FIG. 1A is a bottom view of a semiconductor package according to an example embodiment.
Figure 1B:
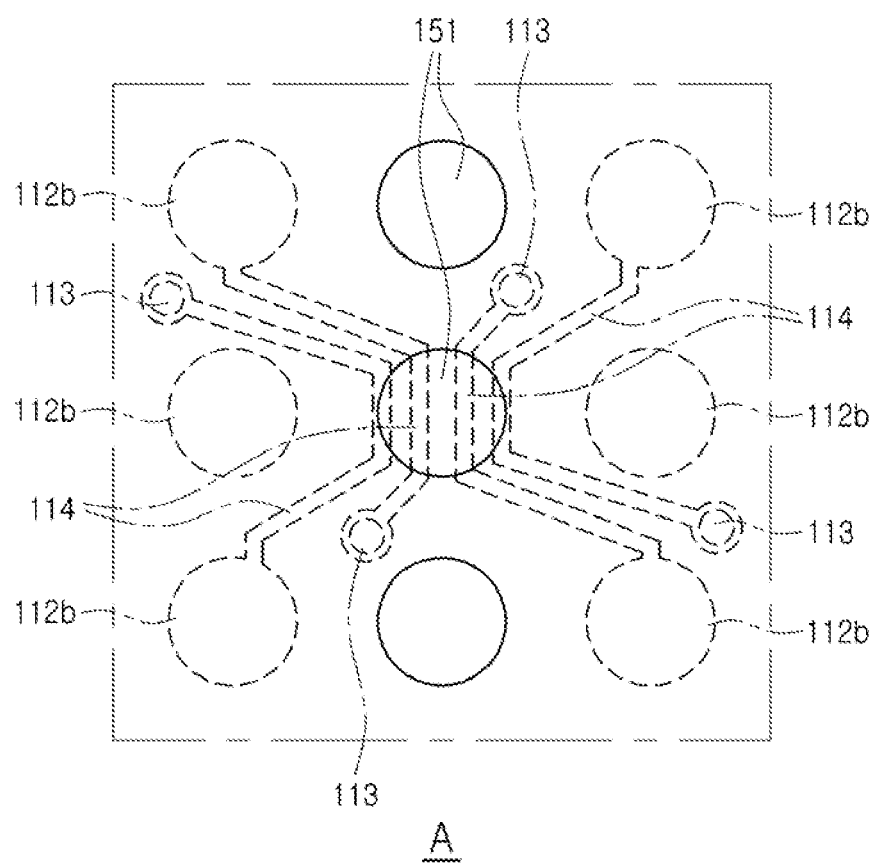
FIG. 1B is a plan view illustrating an arrangement of the redistribution pad, the redistribution pattern, and the dummy pad in portion A of FIG. 1A.
Figure 2:
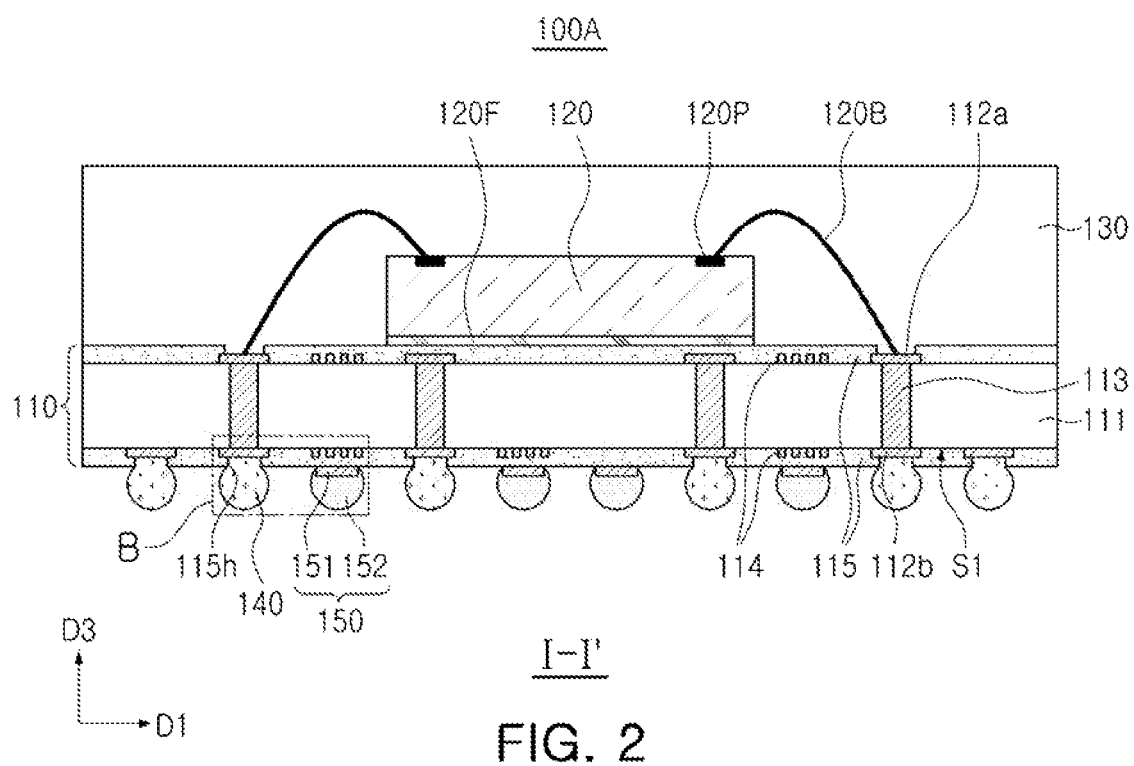
FIG. 2 is a cross-sectional view taken along line I-I' of the semiconductor package of FIG. 1A.
Figure 3:
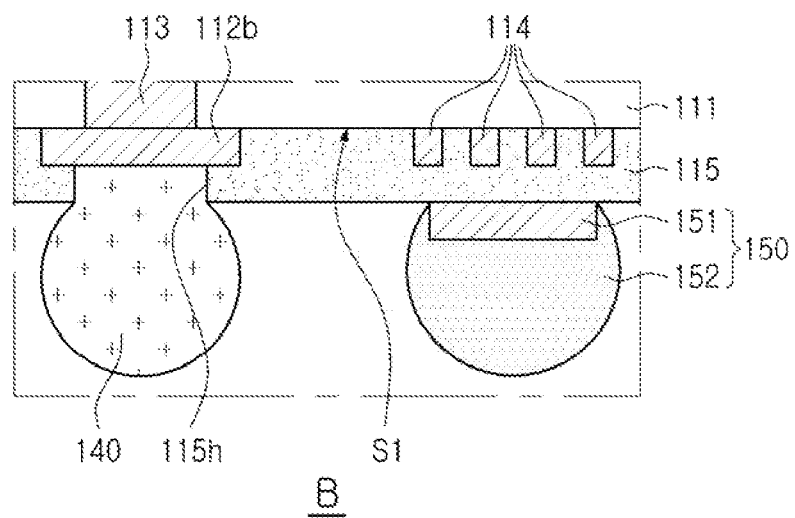
FIG. 3 is an enlarged view of portion B of FIG. 2.
Figure 4:
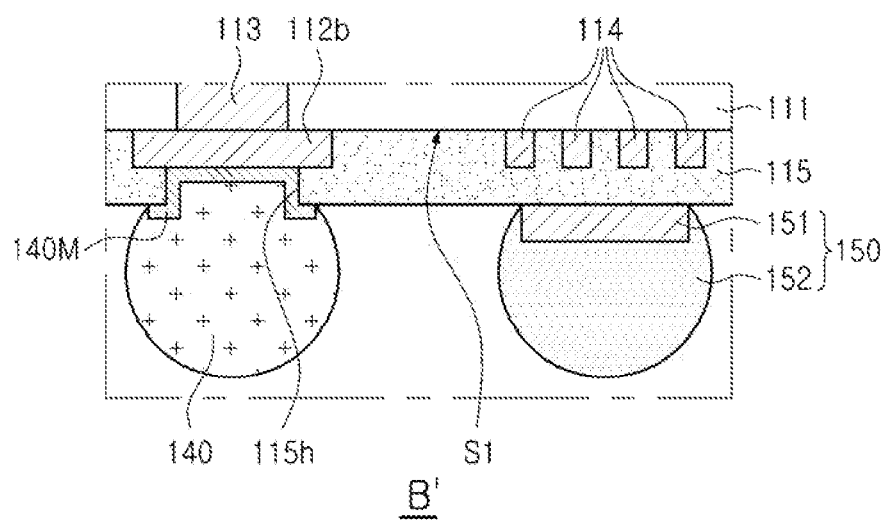
FIG. 4 is an enlarged view of portion B' according to an example embodiment.

FIG. 1A is a bottom view of a semiconductor package according to an example embodiment. FIG. 1B is a plan view illustrating an arrangement of the redistribution pad, the redistribution pattern, and the dummy pad in portion A of FIG. 1A. FIG. 2 is a cross-sectional view taken along line I-I' of the semiconductor package of FIG. 1A. FIG. 3 is an enlarged view of portion B of FIG. 2. FIG. 4 is an enlarged view of portion B' according to an example embodiment.

The portion B' represents a portion corresponding to the portion B of FIG. 3 in an example embodiment.

Referring to FIGS. 1A to 3, a semiconductor package 100A according to an example embodiment may include a redistribution structure 110 that extends in first and second directions D1, D2, a semiconductor chip 120 stacked on the redistribution structure 110 in a third direction D3, an encapsulant 130 surrounding the semiconductor chip, a connection bump 140 at lower surface of the redistribution structure 110 that is opposite in the third direction D3 from an upper surface to which the semiconductor chip 120 is attached, and a dummy structure 150.

The redistribution structure 110 may include an insulating layer 111 having an upper surface and a lower surface S1 that are opposite to each other in the third direction D3, a redistribution pad 112b and a redistribution pattern 114 on the lower surface S1 of the insulating layer 111 and electrically connected to each other (see FIG. 1B), and a passivation layer 115 on the upper surface and the lower surface S1 of the insulating layer 111 and having an opening 115h at the lower surface S1 of the insulating layer 111 that exposes at least a portion of the redistribution pad 112b.

The redistribution structure 110 may further include a redistribution pad 112a on the upper surface of the insulating layer 111, and a redistribution via 113 passing through the insulating layer 111 and electrically connecting the redistribution pad 112a on the upper surface of the insulating layer 111 and the redistribution pad 112b on the lower surface S1 of the insulating layer 111. The redistribution structure 110 may include, for example, a plurality of redistribution pads 112a and 112b, a plurality of redistribution patterns 114 and a plurality of redistribution via 113 electrically connecting the plurality of redistribution pads 112a and 112b to each other, and a passivation layer 115 covering a lowermost redistribution pad 112b among the plurality of redistribution pads 112a and 112b and a lowermost redistribution pattern 114 among the plurality of redistribution patterns 114 and having a first opening 115h exposing at least a portion of the lowermost redistribution pad 112b. In addition, the insulating layer 111, the redistribution pads 112a and 112b, the redistribution via 113, and the redistribution pattern 114 may be included in a larger number, as compared to that illustrated in FIG. 1A. In an example embodiment, the redistribution structure 110 may be a substrate for a semiconductor package, such as a printed circuit board (PCB), a ceramic substrate, a tape wiring board, or the like.

The insulating layer 111 may include an insulating material. The insulating material may include a thermosetting resin such as an epoxy resin, a thermoplastic resin such as polyimide, or a resin impregnated with an inorganic filler or/and glass fiber, glass cloth, or glass fabric, such as a prepreg, an Ajinomoto build-up film (ABF), a flame retardant-4 (FR-4), and bismaleimide triazine (BT). In an implementation, the insulating material may include silicon, germanium, silicon-germanium, gallium-arsenic (GaAs), glass, or the like.

The redistribution pads 112a and 112b may be at opposite surfaces of the insulating layer 111, and the redistribution pad 112a on an upper side and the redistribution pad 112b on a lower side, based on the insulating layer 111, may be electrically connected to each other. The redistribution pad 112a disposed in an uppermost position of the plurality of redistribution pads 112a and 112b on different levels may be electrically connected to a connection pad 120P of the semiconductor chip 120, and the redistribution pad 112b disposed in a lowermost position of the plurality of redistribution pads 112a and 112b on different levels may be electrically connected to an external device by the connection bump 140. The redistribution pads 112a and 112b may include a metal material including copper (Cu), aluminum (Al), silver (Ag), tin (Sn), gold (Au), nickel (Ni), lead (Pb), titanium (Ti), or alloys thereof. The redistribution pads 112a and 112b may perform various functions according to a design. For example, the redistribution pads 112a and 112b may be connected to a ground (GND) pattern, a power (PWR) pattern, and a signal (S) pattern. The signal (S) pattern may be a transmission path of various signals, for example, data signals, except for the ground (GND) pattern and the power (PWR) pattern.

The redistribution via 113 may pass through the insulating layer 111 to electrically connect the plurality of redistribution pads 112a and 112b on different levels, to form an electrical path in the redistribution structure 110. The redistribution via 113 may include a metal material, similar to the redistribution pads 112a and 112b. The redistribution via 113 may have a shape in which the metal material completely fills or is formed along a wall surface of a via hole.

The redistribution pattern 114 may be electrically connected to the redistribution pads 112a and 112b on substantially the same level. For example, as illustrated in FIG. 1B, the lowermost redistribution pattern 114 may be electrically connected to the lowermost redistribution pad 112b and/or the redistribution via 113, and may be located on substantially the same level as the lowermost redistribution pad 112b. The redistribution pattern 114 may be a conductive line electrically connecting the redistribution pads 112a and 112b on the same level to each other, and may serve to redistribute the uppermost redistribution pad 112a directly connected to the semiconductor chip 120 to a fan-out region. The redistribution pattern 114 may have a width narrower than a width of each of the redistribution pads 112a and 112b having various cross-sectional shapes, and may include a ground (GND) pattern, a power (PWR) pattern, or a signal (S) pattern according to a design to be desired. For example, the redistribution pads 112a and 112b and the redistribution pattern 114 may have a rectangular vertical cross-sectional shape, wherein the redistribution pattern 114 may have a width narrower than a width of each of the redistribution pads 112a and 112b. A horizontal cross-sectional shape of the redistribution pads 112a and 112b may be, for example, a circular shape, a square shape, or a droplet shape, and the redistribution pattern 114 may be in the form of a lane extending from one end of the redistribution pads 112a and 112b.

The passivation layer 115 may be on the uppermost and lowermost redistribution pads 112a and 112b and the redistribution pattern 114, and may help to protect them from external physical/chemical damage. The passivation layer 115 may have a plurality of openings 115h exposing at least a portion of the redistribution pads 112a and 112b. The passivation layer 115 may include an insulating material, and may include, for example, prepreg, ABF, FR-4, BT, or a photo solder resist. The passivation layer 115 may directly cover the redistribution pads 112a and 112b and the redistribution pattern 114. The opening 115h may pass through a portion of the passivation layer 115 that vertically overlaps or covers the redistribution pads 112a and 112b, and may not be formed in a region covering the redistribution pattern 114.

The semiconductor chip 120 may have an active surface on which the connection pad 120P is disposed, and a non-active surface opposite to the active surface, and may be on the redistribution structure 110. The connection pad 120P may be electrically connected to the redistribution pads 112a and 112b and the redistribution pattern 114. In an example embodiment, the semiconductor chip 120 may be mounted on the redistribution structure 110 in a wire-bonding manner. For example, the semiconductor chip 120 may be attached to an upper surface of the redistribution structure 110 by an adhesive member 120F on the non-active surface, and the connection pad 120P may be connected to the uppermost redistribution pad 112a by a bonding wire 120B.

The adhesive member 120F may be between the semiconductor chip 120 and the redistribution structure 110, and may fix the semiconductor chip 120. The adhesive member 120F may include an adhesive resin such as a thermosetting resin. The adhesive resin may include, for example, at least one of a bisphenol type epoxy resin, a novolak type epoxy resin, a phenol resin, a urea resin, a melamine resin, an unsaturated polyester resin, and a resorcinol resin. The adhesive member 120F may include a die attach film (DAF).

The semiconductor chip 120 may be an IC chip from a plurality of integrated circuits (ICs) formed on a wafer. The semiconductor chip 120 may include, for example, one or more of a central processor (CPU), a graphics processor (GPU), a field programmable gate array (FPGA), a digital signal processor, a cryptographic processor, a microprocessor, a microcontroller, a logic chip such as an analog-to-digital converter and an application-specific IC (ASIC), or a memory chip such as a volatile memory (e.g., DRAM), a non-volatile memory (e.g., ROM), and a flash memory.

The encapsulant 130 may be on the redistribution structure 110 and may encapsulate the semiconductor chip 120. The encapsulant 130 may include a polymer material, for example, a thermosetting resin such as an epoxy resin, a thermoplastic resin such as a polyimide, or a prepreg, an Ajinomoto build-up film (ABF), a flame retardant-4 (FR-4) material, and bismaleimide triazine (BT), including an inorganic filler or/and glass fiber, glass cloth, or glass fabric.

As illustrated in FIGS. 2 and 3, the connection bump 140 may fill the opening 115h of the passivation layer 115, and may be connected to the lowermost redistribution pad 112b exposed through the opening 115h. The connection bump 140 may vertically overlap the lowermost redistribution pad 112b in the third direction D3. The lowermost redistribution pad 112b may be provided as a plurality of redistribution pads 112b on the same level to each other, and the opening 115h may be provided as a plurality of openings 115h corresponding to at least a portion of the plurality of redistribution pads 112b. The connection bump 140 may be provided as a plurality of connection bumps 140 disposed in each of the plurality of openings 115h.

The connection bump 140 may physically and/or electrically connect the semiconductor package 100A and an external device. The connection bump 140 may include a low-melting-point metal, for example, tin (Sn) or an alloy (Sn—Ag—Cu) containing tin (Sn). The connection bump 140 may have a ball shape. The connection bump 140 may provide a heat conduction path that dissipates heat generated from the semiconductor chip 120, due to properties of a material, to the outside of the semiconductor package 100A.

The connection bump 140 may not be formed on the lowermost redistribution pattern 114. A heat dissipation path for heat to dissipate from the semiconductor package 100A may be provided by a dummy structure 150 or a dummy bump 152, e.g., spaced apart from the redistribution pattern 114 and in a region directly below the lowermost redistribution pattern 114. The dummy structure 150 or the dummy bump 152 may help improve heat dissipation performance of the semiconductor package 100A.

The dummy structure 150 may include a dummy pad 151 on a lower surface of the passivation layer 115 covering the lowermost redistribution pattern 114, and a dummy bump 152 on the dummy pad 151.

The dummy pad 151 may have one surface contacting the lower surface of the passivation layer 115, and remaining surfaces thereof may be covered by the dummy bump 152. The dummy pad 151 may be spaced apart from the redistribution pattern 114 by the passivation layer 115, and may vertically overlap at least a portion of the lowermost redistribution pattern 114 in the third direction D3. The dummy pad 151 may be located on a level lower than the lowermost redistribution pad 112b. The dummy pad 151 may include a metal material containing copper (Cu), aluminum (Al), silver (Ag), tin (Sn), gold (Au), nickel (Ni), lead (Pb), titanium (Ti), or alloys thereof. The dummy pad 151 may help improve adhesion of the dummy bump 152 on the passivation layer 115.

The dummy bump 152 may be on the passivation layer 115 and the dummy pad 151, and may vertically overlap the lowermost redistribution pattern 114 in the third direction D3. The dummy bump 152 may be on the lower surface of the passivation layer 115 covering the lowermost redistribution pattern 114, and may be electrically insulated from the redistribution pattern 114. The dummy bump 152 may be spaced apart from the redistribution pattern 114 by the passivation layer 115. The dummy bump 152 may be provided as a plurality of dummy bumps 152 spaced apart from the connection bump 140, and at least a portion of the plurality of dummy bumps 152 may be arranged in a region directly below the lowermost redistribution pattern 114. Remaining portions of the plurality of dummy bumps 152 may not vertically overlap the lowermost redistribution pad 112b and the lowermost redistribution pattern 114. The dummy bump 152 may be formed by the same process as the connection bump 140, but a distance between the lower surface S1 of the lowermost insulating layer 111 and an upper end of the connection bump 140 may be less than a distance between the lower surface S1 of the lowermost insulating layer 111 and an upper end of the dummy bump 152. The dummy bump 152 may include the same material as the connection bump 140, for example, tin (Sn) or an alloy (Sn—Ag—Cu) containing tin (Sn). The dummy bump 152 may be on the lower surface of the passivation layer 115 in which the connection bump 140 is not disposed, and may provide an additional heat dissipation path.

As illustrated in FIG. 4, an under-bump metal 140M may be provided between the connection bump 140 and the lowermost redistribution pad 112b. The under-bump metal 140M may be disposed in the opening 115h of the passivation layer 115, and may be electrically connected to the lowermost redistribution pad 112b. The under-bump metal 140M may improve reliability for connection of the connection bump 140, and may improve reliability for board level of the package. The under-bump metal 140M may be formed by a metallization method, for example. The under-bump metal 140M may have a via shape that is curved along an inner wall of the opening 115h and a lower surface of the passivation layer 115, or a filled via shape that fills the opening 115h.

Figure 5:
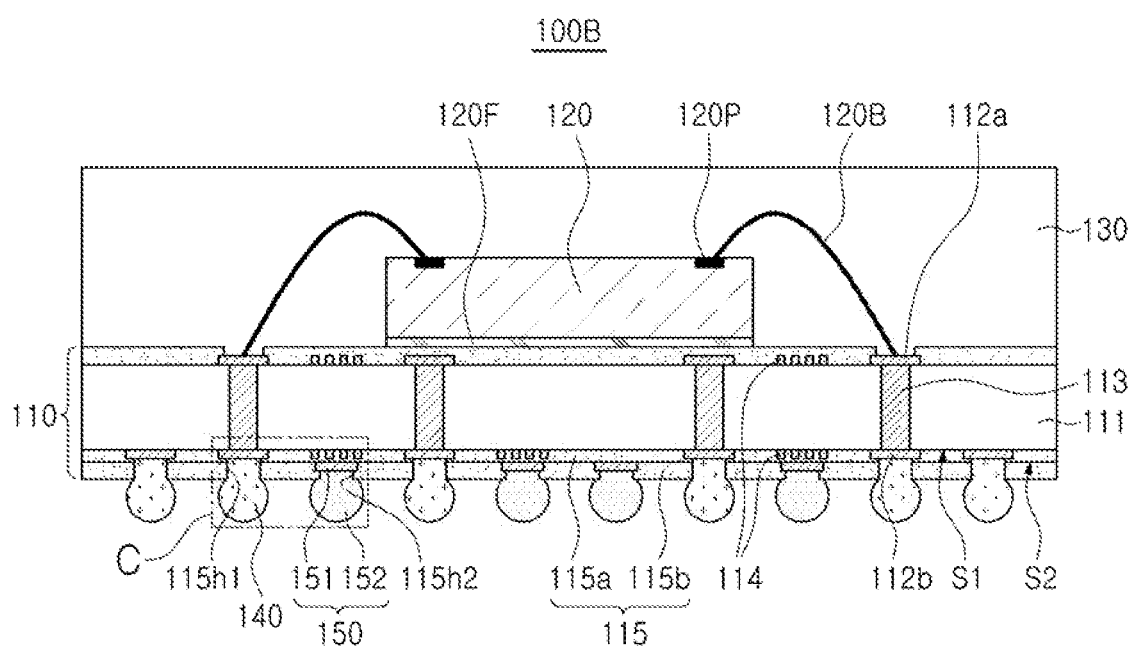
FIG. 5 is a cross-sectional view illustrating a semiconductor package according to an example embodiment.
Figure 6:
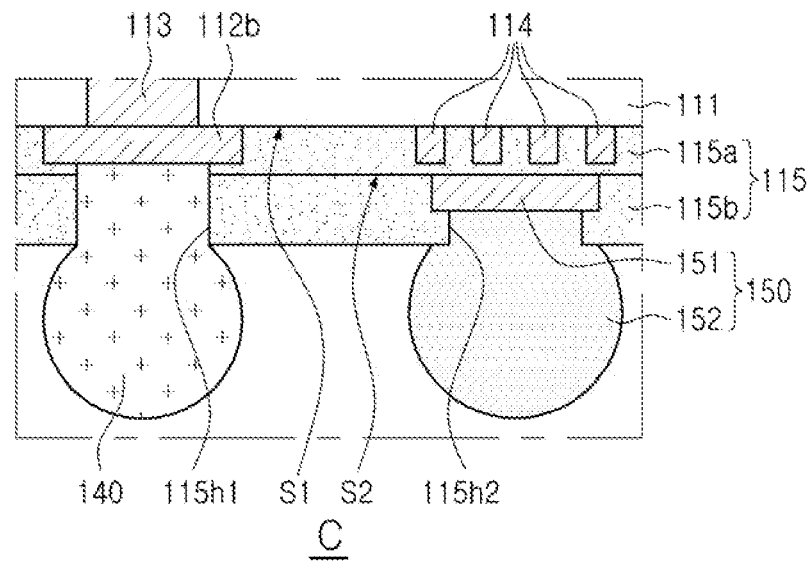
FIG. 6 is an enlarged view of portion C of FIG. 5.
Figure 7:
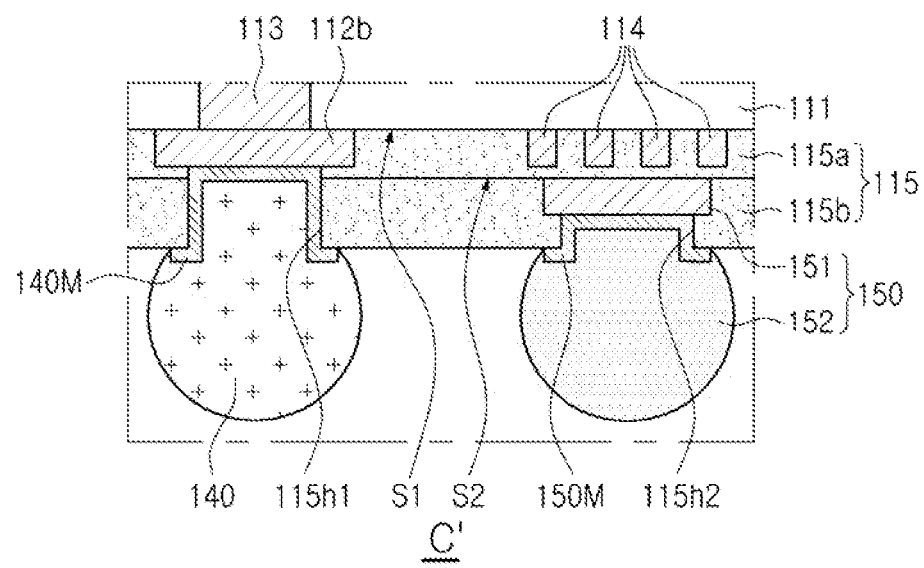
FIG. 7 is an enlarged view of portion C' according to an example embodiment.

FIG. 5 is a cross-sectional view illustrating a semiconductor package 100B according to an example embodiment, FIG. 6 is an enlarged view of portion C of FIG. 5, and FIG. 7 is an enlarged view of portion C' according to an example embodiment. The portion C' represents a portion corresponding to the portion C of FIG. 6 in an example embodiment.

Referring to FIGS. 5 and 6, a passivation layer 115 below a redistribution structure 110, in a semiconductor package 100B according to the present example embodiment, may include a first passivation layer 115a covering a lowermost redistribution pad 112b and a lowermost redistribution pattern 114, and a second passivation layer 115b stacked on the first passivation layer 115a. The passivation layer 115 may have a first opening 115h1 passing through both the first and second passivation layers 115a and 115b, and a second opening 115h2 only passing through the second passivation layer 115b (see FIG. 6). The lowermost redistribution pad 112b may be on a lower surface S1 of a lowermost insulating layer 111, and a dummy pad 151 may be on a lower surface S2 of the first passivation layer 115a. The dummy pad 151 may be between the first passivation layer 115a and the second passivation layer 115b, and at least a portion of the dummy pad 151 may be exposed through the second opening 115h2. The dummy pad 151 may be located on a level lower than the redistribution pad 112b exposed by the first opening 115h1, and spaced apart from the lowermost redistribution pattern 114 by the first passivation layer 115a. The dummy bump 152 may fill the second opening 115h2, and may be in direct contact with the dummy pad 151. The first and second passivation layers 115a and 115b may include the same insulating material, and may be formed by stacking and curing the insulating material. A boundary between the first and second passivation layers 115a and 115b may be varied or blended.

In an example embodiment, as illustrated in FIG. 7, a dummy under-bump metal 150M may be provided between the dummy pad 151 and the dummy bump 152. The dummy under-bump metal 150M may be disposed in the second opening 115h2 to connect the dummy pad 151 and the dummy bump 152. The dummy under-bump metal 150M may improve adhesion of the dummy bump 152. The dummy under-bump metal 150M may be formed by the same process as an under-bump metal 140M.

Among the components illustrated in FIGS. 5 to 7, components having the same reference numerals as in FIG. 2 have similar technical characteristics to those illustrated in FIG. 2, and thus descriptions thereof will be omitted.

Figure 8:
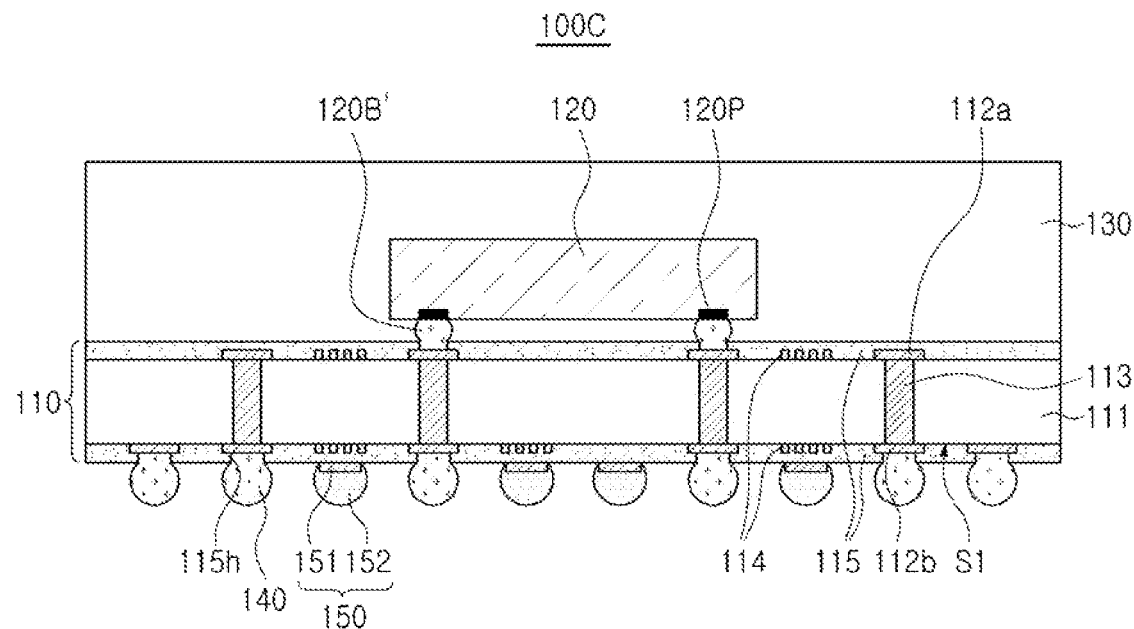
FIG. 8 is a cross-sectional view illustrating a semiconductor package according to an example embodiment.

FIG. 8 is a cross-sectional view illustrating a semiconductor package 100C according to an example embodiment.

Referring to FIG. 8, in a semiconductor package 100C according to the present example embodiment, a semiconductor chip 120 may be mounted on a redistribution structure 110 in a flip-chip bonding method. A connection pad 120P of the semiconductor chip 120 may be connected to an uppermost redistribution pad 112a by a conductive bump 120B'. The conductive bump 120B' may include a solder ball, or a copper pillar. In addition, although not illustrated in the drawing, an underfill resin surrounding the conductive bump 120B' may be between the semiconductor chip 120 and the redistribution structure 110.

Among the components illustrated in FIG. 8, components having the same reference numerals as in FIG. 2 have similar technical characteristics to those illustrated in FIG. 2, and thus descriptions thereof will be omitted.

Figure 9:
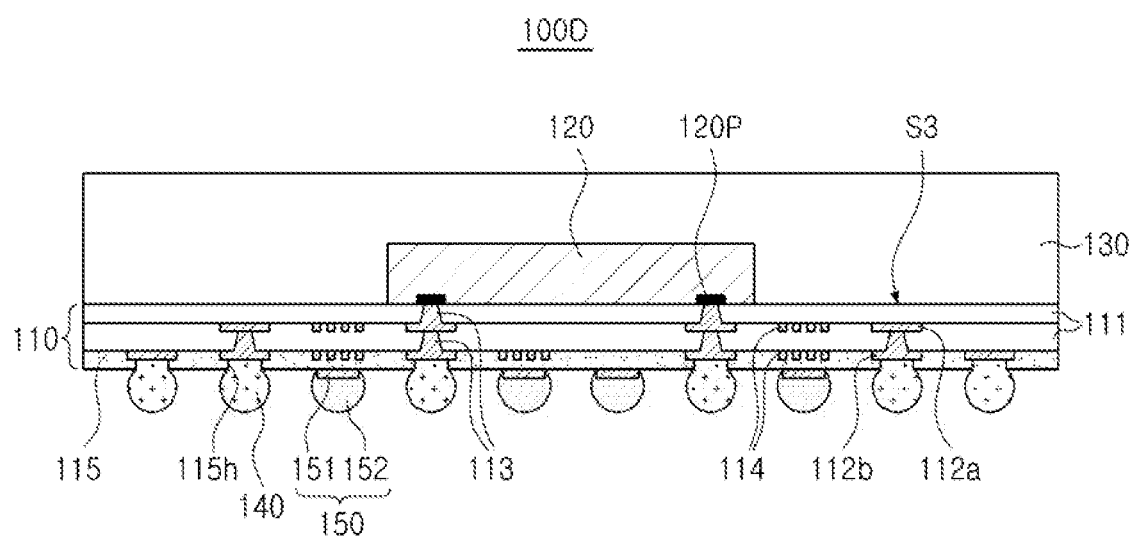
FIG. 9 is a cross-sectional view illustrating a semiconductor package according to an example embodiment.

FIG. 9 is a cross-sectional view illustrating a semiconductor package 100D according to an example embodiment.

Referring to FIG. 9, in a semiconductor package 100D according to the present example embodiment, a redistribution structure 110 may include one or more insulating layers 111, a plurality of redistribution pads 112a and 112b and a plurality of redistribution patterns 114 respectively on the one or more insulating layers 111, and a redistribution via 113 passing through the one or more insulating layers 111 to connect the redistribution pads 112a and 112b on different levels and/or to connect an uppermost redistribution pad 112a and a connection pad 120P. Also, a passivation layer 115 covering both of the redistribution pattern 114 and a redistribution pad 112b, on a lower surface of a lowermost insulating layer 111, may be included. The insulating layer, and the redistribution pads and patterns of the redistribution structure 110 may be provided in greater or fewer numbers than those illustrated in the drawing. Redistribution pads and redistribution patterns, not connected to each other in the drawing, may be connected to each other by bypassing a region not illustrated in the drawing.

The one or more insulating layers 111 may include a photosensitive resin such as PID resin. In this case, the insulating layer 111 may be formed to be relatively thin, and the redistribution via 113 may be finely formed. When the insulating layer 111 is provided as a plurality of insulating layers, the plurality of insulating layers may include the same material or different materials from each other. In addition, when the insulating layer 111 is provided as a plurality of insulating layers, a boundary between the plurality of insulating layers 111 may be varied or blended depending on a process. The redistribution via 113 may be a filled via, filled with a metal material in a via hole, or a conformal via in which the metal material is formed along an inner wall of the via hole.

In the semiconductor package 100D, a semiconductor chip 120 may be in close contact with an upper surface of the redistribution structure 110. An active surface of the semiconductor chip 120 may be in contact with an uppermost insulating layer 111 of the redistribution structure 110, and the connection pad 120P may be directly connected to the redistribution via 113. Therefore, reliability for connection of the connection pad 120P may be improved.

Among the components illustrated in FIG. 9, components having the same reference numerals as in FIG. 2 have similar technical characteristics to those illustrated in FIG. 2, and thus descriptions thereof will be omitted.

Figure 10:
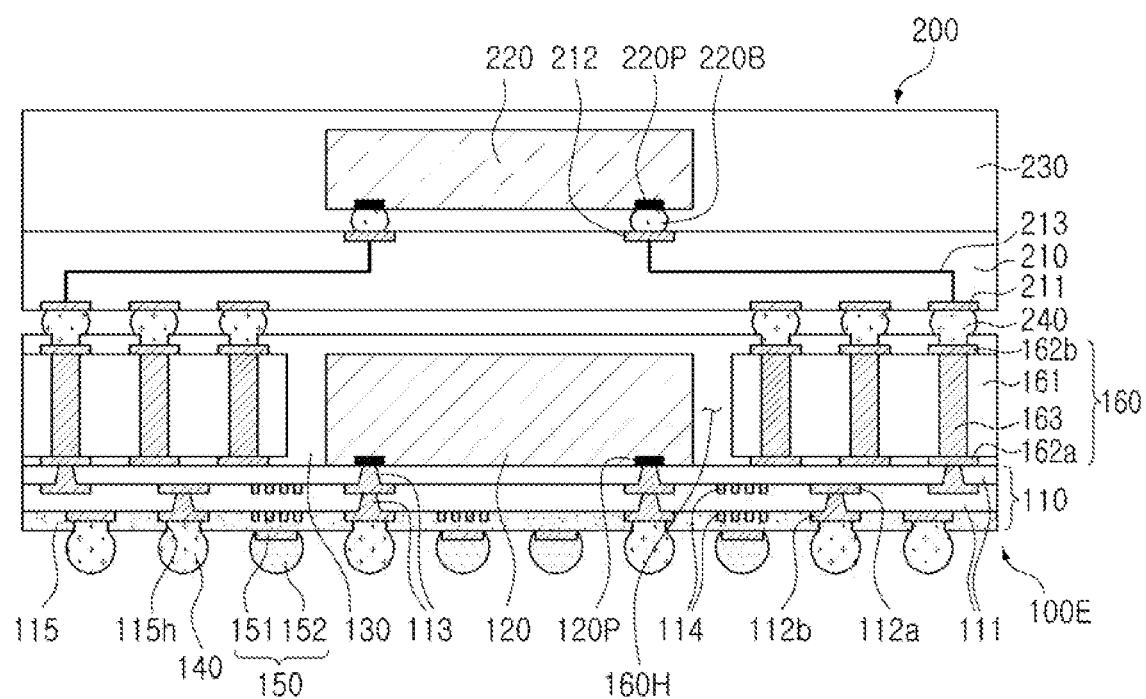
FIG. 10 is a cross-sectional view illustrating a semiconductor package according to an example embodiment.

FIG. 10 is a cross-sectional view illustrating a semiconductor package 100E according to an example embodiment.

Referring to FIG. 10, a semiconductor package 100E according to the present example embodiment may include a vertical connection structure 160 on a redistribution structure 110 and having a through-hole 160H accommodating a semiconductor chip 120. The vertical connection structure 160 may include an insulating layer 161, a plurality of wiring layers 162a and 162b on the upper and lower surfaces of the insulating layer 161, respectively, and a wiring via 163 passing through the insulating layer 161 and electrically connecting the plurality of wiring layers 162a and 162b. The insulating layer, the wiring layer, and the wiring via may be included in a larger number, as compared to those illustrated in the drawing.

The vertical connection structure 160 may improve stiffness of the semiconductor package 100E according to a specific material of the insulating layer 161, and ensure uniform thickness of an encapsulant 130. The vertical connection structure 160 may have the through-hole 160H passing through the insulating layer 161. The semiconductor chip 120 may be disposed in the through-hole 160H. The through-hole 110H may have a shape in which a wall surface thereof surrounds the semiconductor chip 120, for example.

A material of the insulating layer 161 may be, for example, an insulating material, and as the insulating material, a thermosetting resin such as an epoxy resin, a thermoplastic resin such as polyimide, or a resin in which these resins are mixed with an inorganic filler, for example, an Ajinomoto build-up film (ABF). In an implementation, glass fiber, glass cloth, or glass fabric impregnated with the above-described resin may be used together with an inorganic filler, for example, a prepreg.

The wiring layers 162a and 162b may provide upper and lower electrical connection paths of the package together with the wiring via 163, and may serve to redistribute a connection pad 120P. The wiring layers 162a and 162b may include copper (Cu), aluminum (Al), silver (Ag), tin (Sn), gold (Au), nickel (Ni), lead (Pb), titanium (Ti), or alloys thereof. The wiring layers 162a and 162b may include a ground (GND) pattern, a power (PWR) pattern, and a signal (S) pattern according to a design of a corresponding layer. In addition, the wiring layers 162a and 162b may include various types of via pads and the like, respectively. The wiring layers 162a and 162b may be formed by a plating process, and may be composed of a seed layer and a conductor layer, respectively.

The wiring via 163 may electrically connect the wiring layers 162a and 162b formed on different layers, and as a result, an electrical path may be formed in the vertical connection structure 160. The wiring via 163 may include copper (Cu), aluminum (Al), silver (Ag), tin (Sn), gold (Au), nickel (Ni), lead (Pb), titanium (Ti), or alloys thereof. The wiring via 163 may include a signal via, a power via, and a ground via, and the power via and the ground via may be the same via. The wiring via 163 may be a field-type via filled with a metal material, or a conformal-type via in which the metal material is formed along a wall surface of a via hole. The wiring via 163 may be formed by a plating process, and may be composed of a seed layer and a conductor layer.

A second package 200 may be coupled on the semiconductor package 100E. The second package 200 may include a second redistribution structure 210, a second semiconductor chip 220, and a second encapsulant 230.

The second redistribution structure 210 may include redistribution pads 211 and 212 respectively on upper and lower surfaces of the second redistribution structure 210 and electrically connected to the outside, and a redistribution pattern 213 disposed in the second redistribution structure 210 and connecting the redistribution pads 211 and 212. The redistribution pattern 213 may redistribute a connection pad 220P of the second semiconductor chip 220 to a fan-out region.

The second semiconductor chip 220 may include the connection pad 220P, and the connection pad 220P may be electrically connected to the second redistribution structure 210 by a metal bump 220B. The second package 200 may further include an underfill material surrounding the metal bump 220B. The underfill material may be an insulating material including an epoxy resin or the like. The metal bump 220B may include a solder ball or a copper pillar.

In another implementation, similar to that illustrated in FIG. 9, the connection pad 220P of the second semiconductor chip 220 in FIG. 10 may be in contact with the upper surface of the second redistribution structure 210 and may be electrically connected to the redistribution pattern 213 by a via in the second redistribution structure 210.

The second encapsulant 230 may include the same material as, or a material similar to, the encapsulant 130 of the first semiconductor package 100E.

The second package 200 may be physically/electrically connected to the semiconductor package 100E by a second connection bump 240. The second connection bump 240 may be electrically connected to the redistribution pattern 213 in the second redistribution structure 210 by the redistribution pad 211 on the lower surface of the second redistribution structure 210. The second connection bump 240 may be made of a low-melting-point metal, for example, tin (Sn) or an alloy containing tin (Sn). For example, the second connection bump 240 may be formed of a solder or the like.

Among the components illustrated in FIG. 10, components having the same reference numerals as in FIG. 2 have similar technical characteristics to those illustrated in FIG. 2, and thus descriptions thereof will be omitted.

Figure 11:
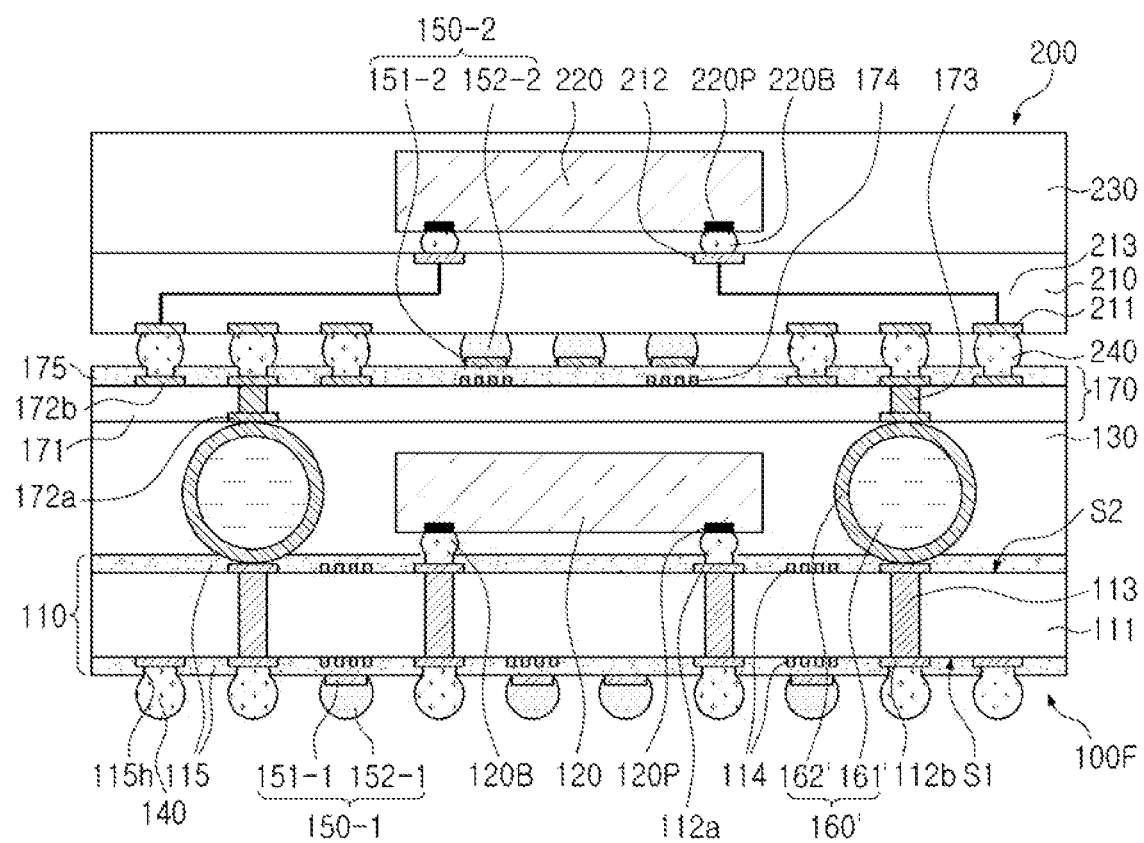
FIG. 11 is a cross-sectional view illustrating a semiconductor package according to an example embodiment.

FIG. 11 is a cross-sectional view illustrating a semiconductor package 100F according to an example embodiment.

Referring to FIG. 11, a semiconductor package 100F according to the present example embodiment may include a second redistribution structure 170 on an encapsulant 130, a vertical connection structure 160' electrically connecting the second redistribution structure 170 and a first redistribution structure 110, and a second dummy structure 150-2 on the second redistribution structure 170.

The second redistribution structure 170 may include a second insulating layer 171, second redistribution pads 172a and 172b, a second redistribution via 173, a second redistribution pattern 174, and a second passivation layer 175. Components of the second redistribution structure 170 may have substantially the same technical characteristics as components of the first redistribution structure 110. Unlike as illustrated in the drawing, a lower surface of the second redistribution structure 170 may be spaced apart from an upper surface of the encapsulant 130, and the second passivation layer 175 may be also on a lower surface of the insulating layer 171.

The vertical connection structure 160' may pass through the encapsulant 130, and may electrically connect an uppermost redistribution pad 112a of the first redistribution structure 110 and a lowermost redistribution pad 172a of the second redistribution structure 170. A plurality of vertical connection structures 160' may be provided to surround a semiconductor chip 120. The vertical connection structure 160' may include a solder ball, a pillar, a core ball, or the like. The vertical connection structure 160' may have a core ball structure including a core 161' formed in a central portion and a solder layer 162' covering the core 161'. The core 161' may include a polymer material including a thermoplastic resin and a thermosetting resin, or a metal material, distinct from solder. The solder layer 162' may include tin (Sn) or an alloy containing tin (Sn).

The second dummy structure 150-2 may include a second dummy pad 151-2 and a second dummy bump 152-2. The second dummy pad 151-2 may be on an upper surface of the second passivation layer 175 to vertically overlap an uppermost second redistribution pattern 174, and the second dummy bump 152-2 may be on the second dummy pad 151-2. The second dummy structure 150-2 may provide a heat dissipation path in a region in which a second connection bump 240 is not disposed. The second dummy structure 150-2 may have substantially the same technical characteristics as a first dummy structure 150-1.

Among the components illustrated in FIG. 11, components having the same reference numerals as in FIG. 2 have similar technical characteristics to those illustrated in FIG. 2, and thus descriptions thereof will be omitted.

Figure 12:
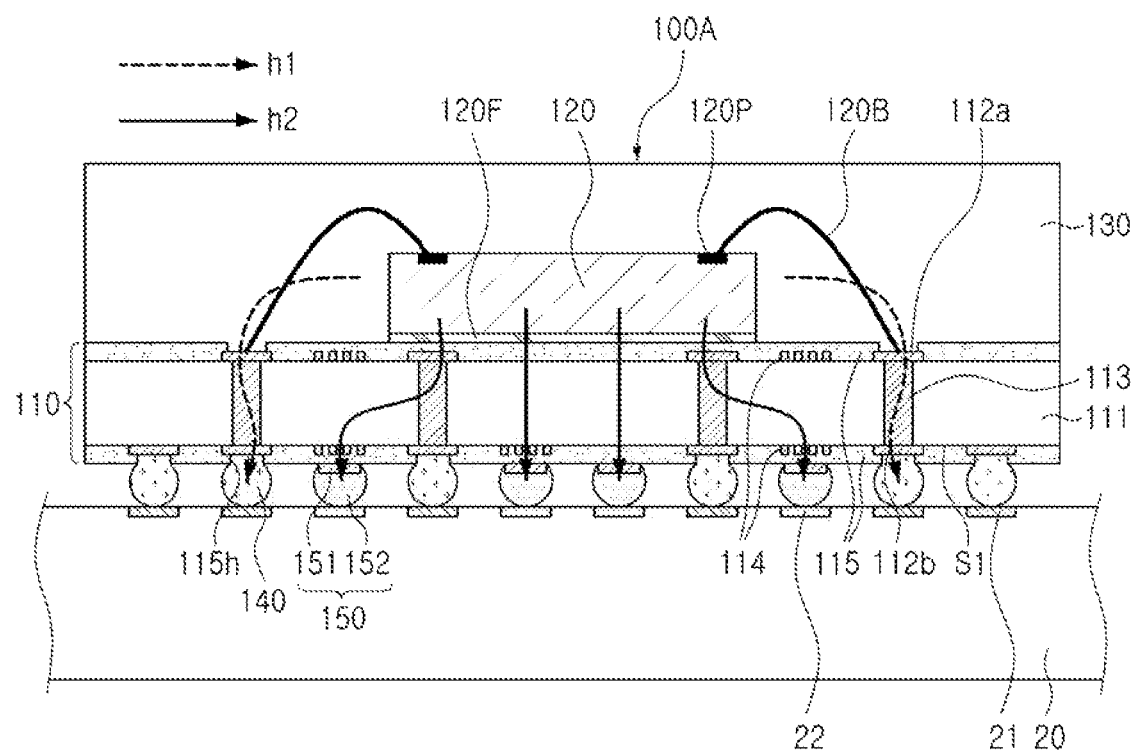
FIG. 12 is a cross-sectional view illustrating a state in which the semiconductor package of FIG. 2 is mounted on a substrate.

FIG. 12 is a cross-sectional view illustrating a state in which the semiconductor package 100A of FIG. 2 is mounted on a substrate.

Referring to FIG. 12, a first pad 21 connected to the connection bump 140 and a second pad 22 connected to the dummy bump 152 may be on an upper surface of a mounting substrate 20. The connection bump 140 may be connected to the first pad 21, and may provide a primary heat transfer path h1. An additional heat transfer path h2 may be provided through the dummy bump 152. In an implementation, the second pad 22 connected to the dummy bump 152 may be omitted.

Figure 13:
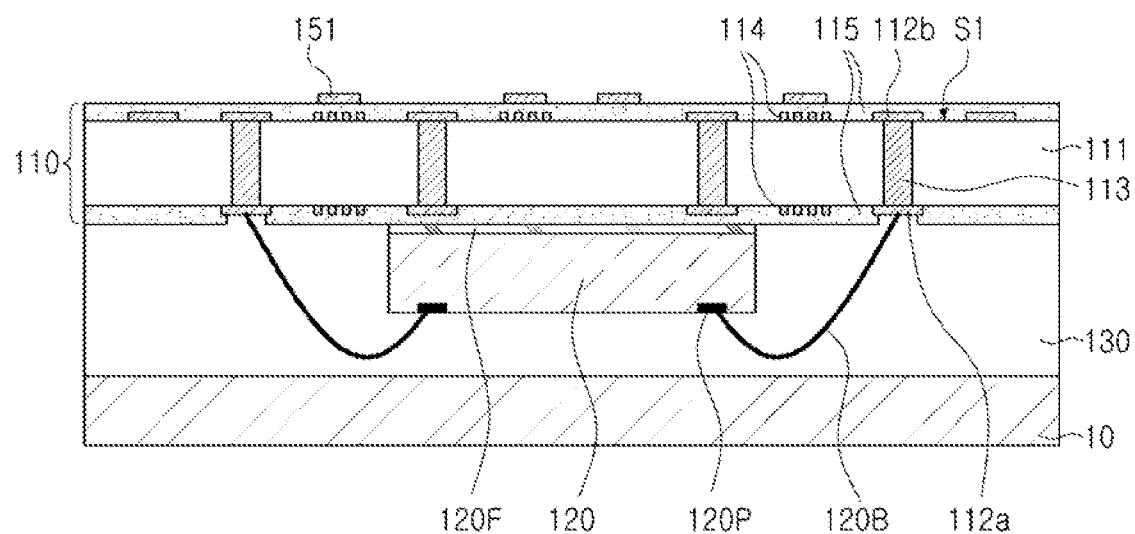
FIGS. 13 to 15 are cross-sectional views schematically illustrating a method of manufacturing the connection bump and the dummy bump in the semiconductor package of FIG. 2.
Figure 14:
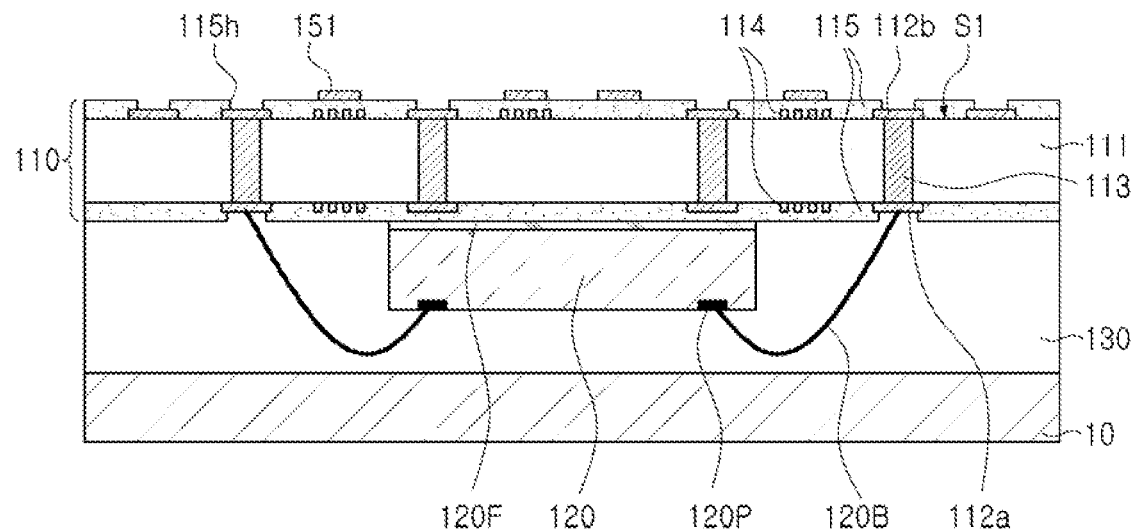
Figure 15:
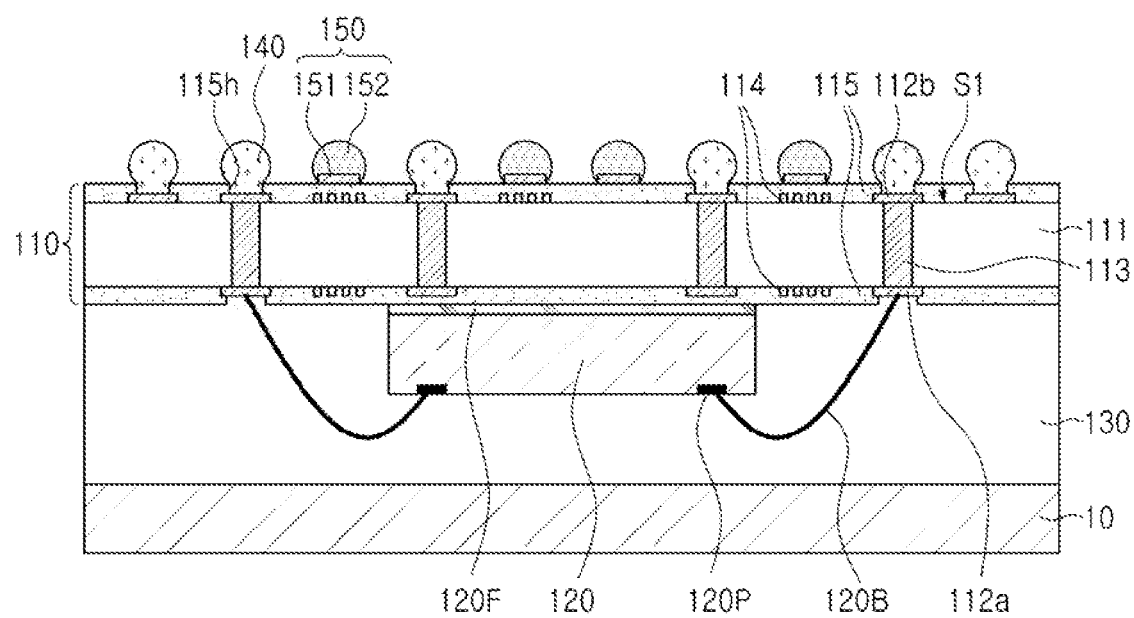

FIGS. 13 to 15 are cross-sectional views schematically illustrating a method of manufacturing the connection bump 140 and the dummy structure 150 in the semiconductor package 100A of FIG. 2.

Referring to FIG. 13, a semiconductor chip 120 and an encapsulant 130 may be formed on a redistribution structure 110, and a carrier film 10 may be attached to the encapsulant 130. A dummy pad 151 may be formed on an upper surface of the redistribution structure 110. The dummy pad 151 may be formed by an electroless plating process and/or an electrolytic plating process, after patterning a dry film. The dummy pad 151 may be formed in a region directly on a redistribution pattern 114.

Referring to FIG. 14, an opening 115h passing through a passivation layer 115 to expose a redistribution pad 112b may be formed. The opening 115h may be provided as a plurality of openings, corresponding to the redistribution pad 112b. The opening 115h may be formed by a physical or/and chemical process. For example, the opening 115h may be formed using a laser drill.

Referring to FIG. 15, a connection bump 140 filling the opening 115h and a dummy bump 152 covering the dummy pad 151 may be formed. A connection bump 140 and the dummy pad 151 may be formed in the same reflow process as each other, and may include the same material.

As described above, in an example embodiment, a dummy bump may be formed in a portion of a solder resist covering a circuit pattern, and may provide a semiconductor package with improved heat dissipation performance.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor package, comprising:
    a redistribution structure having an upper surface and a lower surface opposite to each other, and including:
        a plurality of redistribution pads on the lower surface of the redistribution structure,
        at least one redistribution pattern extending from one end of the plurality of redistribution pads and passing between at least one pair of redistribution pads among the plurality of redistribution pads,
        a passivation layer having a first surface covering the plurality of redistribution pads and the at least one redistribution pattern, and a second surface opposite to the first surface, and
        a plurality of dummy pads on the second surface of the passivation layer;
    a semiconductor chip on the upper surface of the redistribution structure and electrically connected to the plurality of redistribution pads;
    at least one connection bump on the plurality of redistribution pads; and
    at least one dummy bump on the plurality of dummy pads,
    wherein, on a plane parallel to the second surface, at least one dummy pad among the plurality of dummy pads is between the at least one pair of redistribution pads.

2. The semiconductor package as claimed in claim 1, wherein the at least one redistribution pattern has a width narrower than a width of the plurality of redistribution pads.

3. The semiconductor package as claimed in claim 1, wherein the passivation layer is in direct contact with the plurality of redistribution pads and the at least one redistribution pattern.

4. The semiconductor package as claimed in claim 1, wherein the at least one dummy pad among the plurality of dummy pads is electrically insulated from the at least one redistribution pattern.

5. The semiconductor package as claimed in claim 1, wherein:
    the passivation layer has at least one opening extending from the first surface to the second surface, and
    the at least one connection bump is electrically connected to at least one of the redistribution pads through the at least one opening of the passivation layer.

6. The semiconductor package as claimed in claim 1, wherein the at least one dummy bump is spaced apart from the at least one redistribution pattern by the passivation layer.

7. The semiconductor package as claimed in claim 1, wherein the at least one connection bump and the at least one dummy bump include the same material.

8. The semiconductor package as claimed in claim 1, wherein the passivation layer includes a photo solder resist.

9. The semiconductor package as claimed in claim 1, further comprising an encapsulant on the upper surface of the redistribution structure and encapsulating the semiconductor chip.

10. The semiconductor package as claimed in claim 1, wherein, on a plane parallel to the second surface, at least one dummy pad among the plurality of dummy pads overlaps the at least one redistribution pattern.

11. A semiconductor package, comprising:
    a redistribution structure having an upper surface and a lower surface opposite to each other, and including:
        a plurality of redistribution pads on the lower surface of the redistribution structure,
        at least one redistribution pattern extending from one end of the plurality of redistribution pads and passing between at least one pair of redistribution pads among the plurality of redistribution pads,
        a passivation layer having a first surface covering the plurality of redistribution pads and the at least one redistribution pattern, and a second surface opposite to the first surface, and
        a plurality of dummy pads on the second surface of the passivation layer;
    a semiconductor chip on the upper surface of the redistribution structure and electrically connected to the plurality of redistribution pads;
    at least one connection bump on the plurality of redistribution pads; and
    at least one dummy bump on the plurality of dummy pads,
    wherein, on a plane parallel to the second surface, at least one dummy pad among the plurality of dummy pads overlaps the at least one redistribution pattern in a direction perpendicular to the second surface.

12. The semiconductor package as claimed in claim 11, wherein the at least one dummy pad does not overlap with the plurality of redistribution pads.

13. The semiconductor package as claimed in claim 11, wherein the at least one pair of redistribution pads and the at least one redistribution pattern are on a same level.

14. The semiconductor package as claimed in claim 11, wherein the at least one pair of redistribution pads and the at least one redistribution pattern are in direct contact with the first surface of the passivation layer.

15. The semiconductor package as claimed in claim 11, wherein the plurality of dummy pads are in direct contact with the second surface of the passivation layer.

16. The semiconductor package as claimed in claim 11, wherein the passivation layer is between the plurality of dummy pads and the at least one redistribution pattern.

17. The semiconductor package as claimed in claim 11, wherein:
the redistribution structure further includes one or more insulating layers defining the upper surface and the lower surface, and
the plurality of redistribution pads are on a lowermost insulating layer among the one or more insulating layers.

18. The semiconductor package as claimed in claim 17, wherein the one or more insulating layers and the passivation layer include different materials.

19. A semiconductor package, comprising:
a redistribution structure including an upper redistribution pad, a lower redistribution pad opposite to the upper redistribution pad, and a redistribution via electrically connecting the upper redistribution pad and the lower redistribution pad;
a semiconductor chip on the redistribution structure and electrically connected to the upper redistribution pad;
a passivation layer below the redistribution structure and covering the lower redistribution pad;
a connection bump penetrating through the passivation layer and electrically connected to the lower redistribution pad;
a dummy pad below the passivation layer and located on a level lower than the lower redistribution pad; and
a dummy bump below the dummy pad.

20. The semiconductor package as claimed in claim 19, wherein:
the redistribution structure further includes at least one redistribution pattern extending from one end of the upper redistribution pad or the lower redistribution pad, and
the dummy pad is on a level lower than the at least one redistribution pattern.

* * * * *